United States Patent
Yamaguchi et al.

(10) Patent No.: US 6,477,965 B2
(45) Date of Patent: Nov. 12, 2002

(54) POWER CONVERSION DEVICE FOR A RAIL WAY VEHICLE

(75) Inventors: Yoshihiro Yamaguchi, Tokyo (JP); Hiroaki Yoshinari, Tokyo (JP); Takashi Hashimoto, Saitama-ken (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/801,827

(22) Filed: Mar. 9, 2001

(65) Prior Publication Data

US 2001/0030881 A1 Oct. 18, 2001

(30) Foreign Application Priority Data

Mar. 10, 2000 (JP) ........................................ 2000-065972

(51) Int. Cl.⁷ ................................................ H02M 1/00
(52) U.S. Cl. ........................ 105/59; 361/695; 363/141
(58) Field of Search ................................. 361/688, 689, 361/695, 690, 692, 696, 697; 363/141; 454/83, 99, 100, 101, 103, 107, 115, 228, 234, 237; 105/49, 59, 463.1

(56) References Cited

U.S. PATENT DOCUMENTS

| | | | |
|---|---|---|---|
| 6,215,682 B1 | * | 4/2001 | Akamatsu .................... 361/699 |
| 6,235,983 B1 | * | 5/2001 | Becker et al. ............... 136/248 |
| 6,302,781 B1 | * | 10/2001 | Ayres et al. ................ 361/695 |

FOREIGN PATENT DOCUMENTS

| | | | |
|---|---|---|---|
| JP | 63-52663 | * | 3/1988 |
| JP | 1-243844 | * | 9/1989 |
| JP | 5-36876 | * | 2/1993 |
| JP | 5-71743 | * | 3/1993 |
| JP | 5-244771 | * | 9/1993 |
| JP | 6-625574 | * | 3/1994 |
| JP | 7-15975 | * | 7/1995 |
| JP | 2000-65972 | | 3/2000 |
| JP | 2001-167959 | | 6/2001 |

* cited by examiner

*Primary Examiner*—Mark T. Le
(74) *Attorney, Agent, or Firm*—Finnegan, Henderson, Farabow, Garrett & Dunner, L.L.P.

(57) ABSTRACT

In the railway vehicle power conversion device, an air flow passage is formed by providing an L-shaped partition plate whose long side is in the rail direction, in the interior of a box suspended below the floor of the vehicle. On one side of this partition plate, there are included, in order of the rail direction, a high-speed circuit breaker, relay unit, interface unit and control device. On the other side of partition plate, a pair of smoothing reactors are included on the short side of L-shaped partition plate, and a semiconductor cooling unit is included on the other side of the smoothing reactors and partition. A heat-radiating part of this semiconductor unit projects at the side of air inlet port of air flow passage. Electrically driven fans are fixed within an airflow passage at the smoothing reactors.

12 Claims, 8 Drawing Sheets

POWER CONVERSION DEVICE FOR A RAIL WAY VEHICLE

BACKGROUND OF THE INVENTION

1. Field of the Invention

The present invention relates to a power conversion device for a rail way vehicle.

2. Description of the Related Art

A rail way vehicle incorporates a power conversion device wherein speed control of an induction motor that constitutes the main motor is achieved by converting AC power that is supplied from a pantograph to predetermined AC power by a variable voltage variable frequency controlled inverter.

This rail way vehicle power conversion device is assembled in a box that is suspended under the floor of the vehicle; in the interior of this box, in addition to a power conversion unit comprising power semiconductor elements etc, there are accommodated a capacitor that removes harmonic components contained in the main circuit current, and a high-speed circuit breaker and the like provided to isolate the input power source side and the power conversion unit in the event of occurrence of a fault.

Apart from the foregoing electrical equipment, in addition to the capacitor mentioned above, there may also be accommodated a smoothing reactor on the inverter side for suppressing pulsation of the main circuit current and a smoothing reactor on the power source side of this inverter; of these, the amount of heat generated by the reactor, to be described, on the power source side is considerable.

These smoothing reactors may be mounted externally of the box, but the maximum allowed temperature of these smoothing reactors, due to the insulating resin that effects installation between the layers of their internal coils and the frame, is about 180°; this is higher than that of the semiconductors, capacitors and circuit board of the control device, to be described, etc., which is about 80°.

As a method of cooling these smoothing reactors and control circuit components, conventionally two methods were adopted, namely, the method of forced cooling using an electrically driven fan (or blower), and the method of cooling using the method of natural convection including the current of air generated by the running of the train.

Of these, the cooling effect of the former i.e. the forced cooling method is high, but the latter i.e. the natural ventilation method is considered desirable on account of the vibration and noise generated by an electrically driven fan, and environmental considerations.

On the other hand, to cope with the continual increase in train speeds, increased capacity and reduced weight of the rail way vehicle power conversion device is demanded and size reduction is also sought, in order to enable this to be arranged in the restricted space under the vehicle floor.

In addition, laborsaving in maintenance and inspection and improvement in the ease of performing the maintenance and inspection tasks are demanded.

Of these, the aforementioned increased capacity and reduction in size and weight and laborsaving in maintenance and inspection are mutually contradictory; measures for cooling the equipment incorporated in the interior of the rail way vehicle power conversion device are therefore becoming increasingly important in order to maintain the prescribed performance in regard to vehicle running over a long period, and to meet these contradictory demands.

However, in conventional rail way vehicle power conversion devices, as regards cooling, devices were easier to manufacture, compared with other electrical equipment, in which a smoothing reactor whose allowed rise in temperature was about 100° higher than that of the other electrical equipments ware separately provided.

However, if this was thus separately provided, the amount of space required under the floor for an airflow passage (air dust) for cooling the smoothing reactor and for conductors to effect connection of the power conversion unit connected to this smoothing reactor was thereby increased, complicating the arrangement of electrical equipment under the floor of the vehicle.

On the other hand, in the case of the method in which the smoothing reactor is accommodated in a box together with the other electrical equipment, if this was arranged in series (single air flow system) with respect to the flow path of the cooling air through these items of electrical equipment, the amount of the current of air for cooling the smoothing reactor on the power source side, where the amount of heat generated is largest, must also pass the smoothing reactor on the inverter side, where the amount of heat generated is small; thus the efficiency, taking into account pressure loss, is lowered, making it impossible to meet demands for increased capacity, lighter weight and smaller size.

Furthermore, since the maximum allowable temperatures of these smoothing reactors are the same, the cooling conditions of the smoothing reactor arranged downstream of the smoothing reactor arranged on the upstream side are adversely affected, with the result that its rise in temperature is higher than that of the smoothing reactor on the upstream side.

If, with this in view, the flow paths of the two smoothing reactors are arranged in parallel (two air flow systems), the construction of the flow paths becomes complicated due to these parallel flow paths and due to the baffle plate arranged upstream of these flow paths; this arrangement also therefore cannot meet demands for increased capacity, lighter weight and reduced size and laborsaving in maintenance and inspection.

SUMMARY OF THE INVENTION

Accordingly, one object of the present invention is to provide a novel rail way vehicle power conversion device capable of coping with increased train speeds and capable of coping with increased capacity, smaller size and lighter weight as well as laborsaving in maintenance and inspection. A second object thereof is to obtain a rail way vehicle power conversion device wherein vibration and noise can be reduced.

In order to achieve the above objects, the present invention is constructed as follows. Specifically, it consists in a rail way vehicle power conversion device comprising: a power conversion device comprising a semiconductor power conversion cooling unit, a pair of smoothing reactors and a pair of electrically driven fans which cool these; and a box accommodating power conversion device in its interior and suspended under the floor of the vehicle;

wherein an airflow passage of L-shaped transverse cross section is provided, formed with an inlet port on one side in the rail direction of the box;

a semiconductor power conversion cooling unit being accommodated in a region adjacent the airflow passage on one side in the tie direction of the box, with a heat-radiating part thereof projecting on the air inlet side of the airflow passage;

a pair of smoothing reactors being accommodated in the rail direction on the exhaust side of the airflow passage; and electrically driven fans being arranged at the air inlet side of the smoothing reactors.

By such means, according to the present invention, the flow speed of the cooling air passing through this exhaust path can be lowered and the difference in cooling conditions of the reactors can be decreased, by accommodating the pair of reactors in an exhaust path formed by bending in a direction orthogonal to the air inlet path of the airflow passage.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
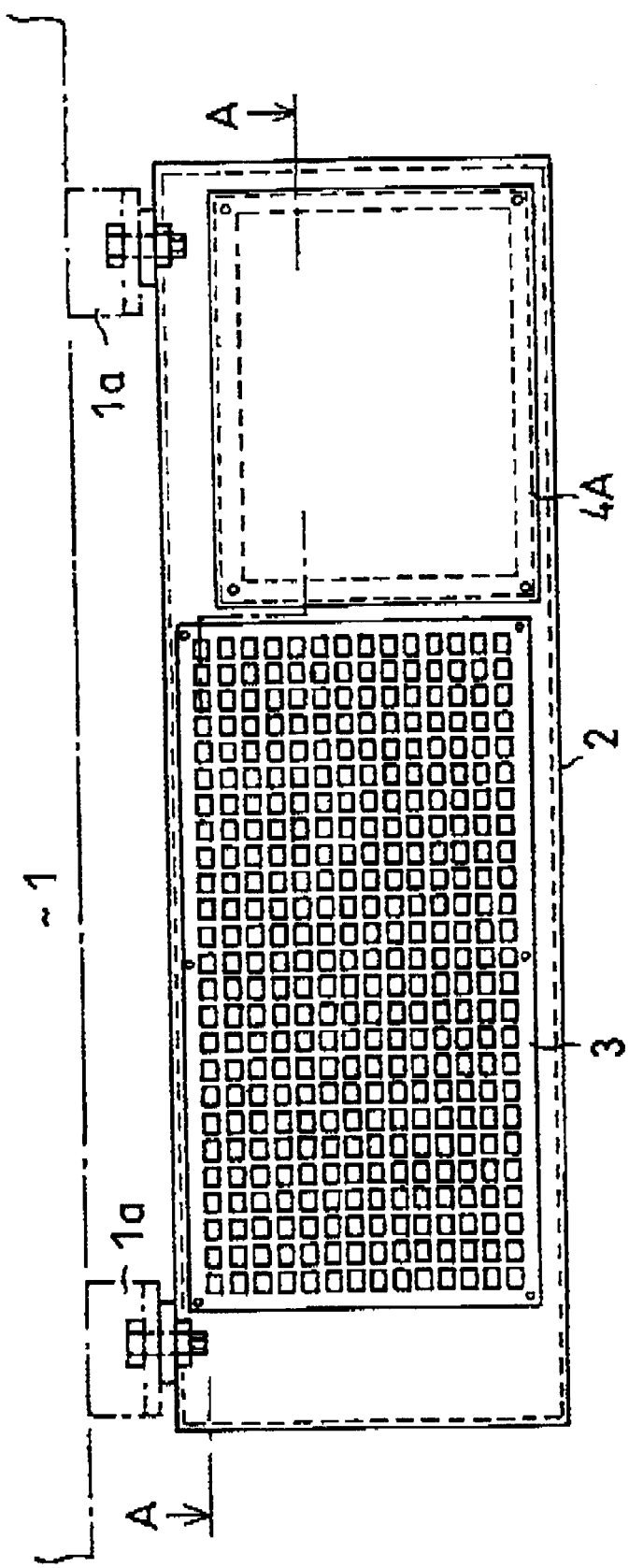
FIG. 1 is a front view illustrating a first embodiment of a rail way vehicle power conversion device according to the present invention.

Referring now to the drawings, wherein like reference symbols designate identical or corresponding parts throughout the several views, and more particularly to FIG. 1 thereof, one embodiment of the present invention will be described.

Figure 2:
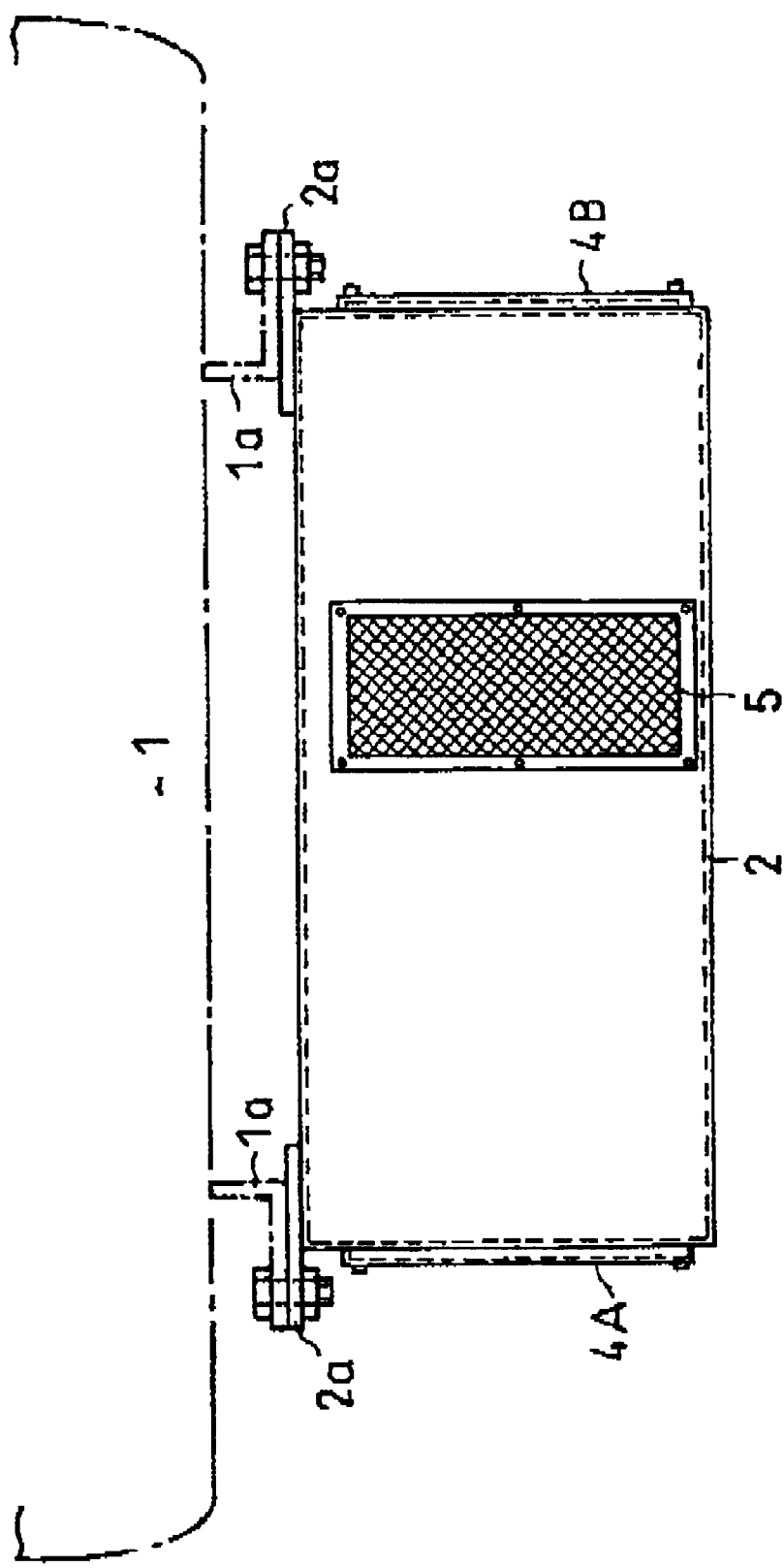
FIG. 2 is a right side view of FIG. 1.

FIG. 1 is a front view illustrating a first embodiment of a rail way vehicle power conversion device according to the present invention, and shows a view of the vehicle body seen from the side (direction of the ties, cross ties or sleepers) of the condition suspended beneath the floor of the body of the vehicle; FIG. 2 is a view from the right-hand side of FIG. 1 (i.e. a view seen from the direction of the rails).

Figure 3:
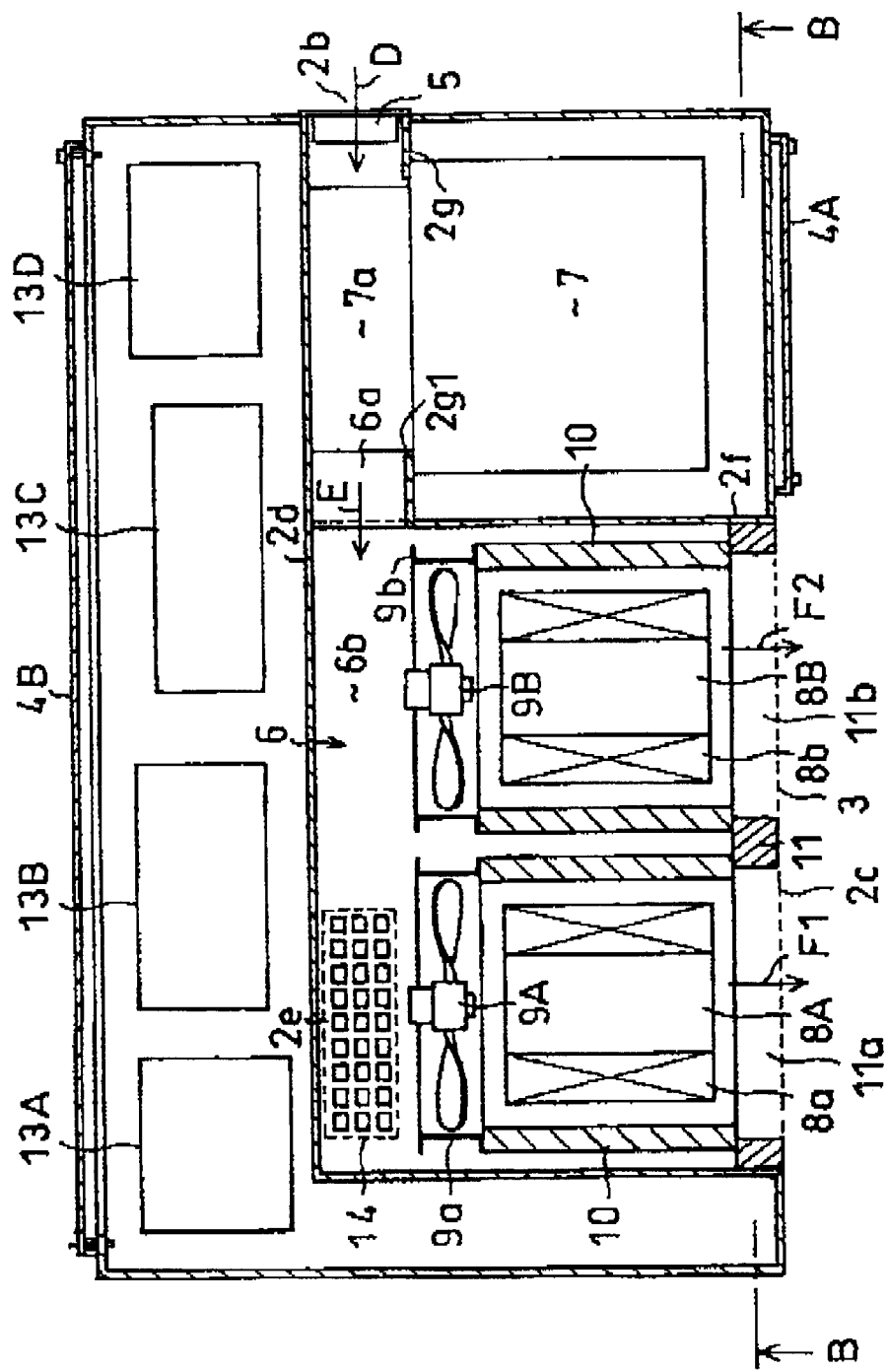
FIG. 3 is a cross-sectional view along the line A—A of FIG. 1.
Figure 4:
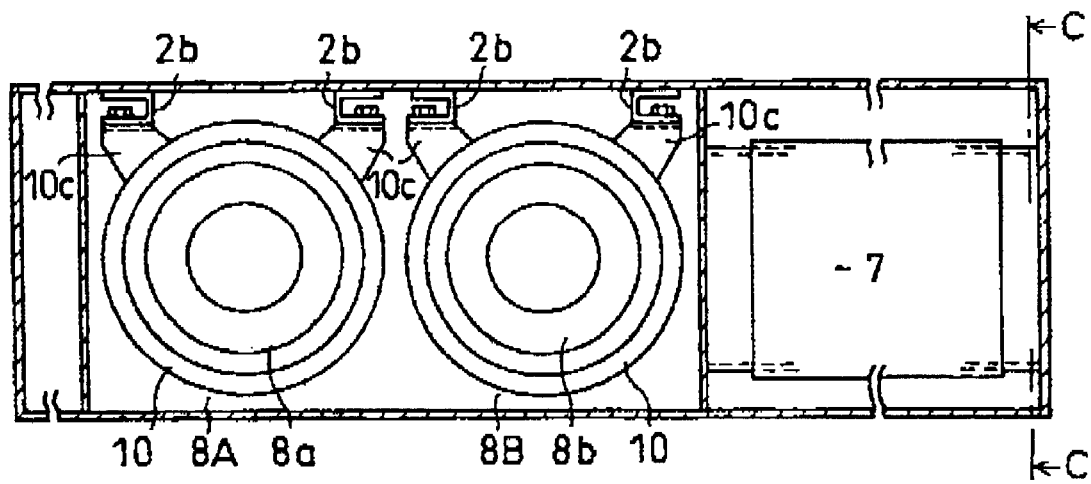
FIG. 4 is a cross-sectional view along the line B—B of FIG. 3.
Figure 5:
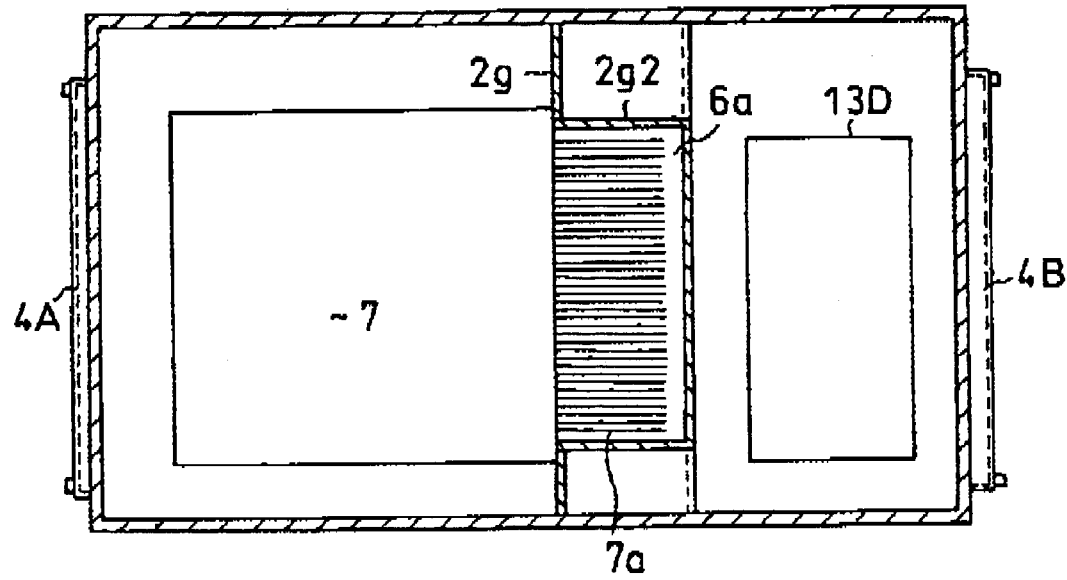
FIG. 5 is a cross-sectional view along the line C—C of FIG. 4.

Also, FIG. 3 is a cross-sectional view along the line A—A of FIG. 1, FIG. 4 is a cross-sectional view along the line B—B of FIG. 3; and FIG. 5 is a cross-sectional view along the line C—C of FIG. 4.

In FIG. 1, FIG. 2, FIG. 3, FIG. 4 and FIG. 5, the box 2 of the rail way vehicle power conversion device is suspended by means of flat plates 2a welded on both sides of its upper end with respect to two sets of L-shaped brackets 1a erected vertically under the floor of this vehicle body 1, on the underside of vehicle body 1.

As shown in FIG. 1, on one side of box 2 on the side in the direction of the ties, an open cover 3 formed with punched holes in honeycomb shape is provided outside exhaust port 2c shown in transverse cross section in FIG. 3, and is fixed by a plurality of bolts.

On the right-hand side in FIG. 1 of this open cover 3, an inspection cover 4A formed in U shape in transverse cross-sectional view in FIG. 3 is fixed by a plurality of bolts.

On the underside of box 2 in FIG. 1, as shown in FIG. 3 and FIG. 5, a large inspection cover 4B is fixed by a plurality of bolts.

In the right-side view of box 2 in FIG. 1, an air filter 5 shown in right side view in FIG. 2 and in transverse cross-sectional view in FIG. 3 is releasably mounted on air inlet 2b. A fine steel mesh is assembled as the filter member of this air filter 5.

As shown in transverse cross-sectional view in FIG. 3, inside of box 2, there is provided an approximately inverted L-shaped partition plate 2d that partitions the interior in the direction of the ties, with its long side facing the rail direction; on the bottom plate of box 2, a small release plate 14 with small punched holes arranged in honeycomb shape is fixed from below by bolts with respect to air inlet 2e formed to the rear of electrically driven fan (or blower) 9A of FIG. 3.

In the bottom plate of box 2, there is formed a rectangular aperture, not shown, with respect to a position below the front electrically driven tans (or blower) 9A and 9B in FIG. 3 of air inlet 2e; an inspection cover is fixed from below by a plurality of bolts on to this aperture.

A partition plate 2f is provided in the direction of the ties on the right side of the intermediate section of box 2 in FIG. 3; to the rear of this partition plate 2f in FIG. 3, there is formed a partition 2g that is bent rightwards; a square hole 2g1 is formed in the middle of this partition 2g.

By means of this partition 2g and partition 2f and L-shaped partition plate 2d described above, as shown in FIG. 3, cooling air flows into the interior of box 2 as shown by arrow D from air inlet 2b and further flows downwards as shown by arrow E, thereby forming a practically L-shaped cooling airflow passage 6 whereby air flows out as shown by arrows F1 and F2, from exhaust port 2c.

Meanwhile, as shown in FIG. 3 and FIG. 5, a radiating part 7a that protrudes rearwardly of semiconductor cooling unit 7 which is accommodated to the rear of inspection cover 4A passes through square hole 2g1 together with cover 2g2 shown in FIG. 5, which covers this vertically.

Within this air dust 6, on the left side of partition 2f, smoothing reactors 8A and 8B shown in FIG. 3 and FIG. 4 are suspended by bolts on a channel-section frame 2b welded to the under-surface of the ceiling plate of box 2 as shown in FIG. 4, by means of a pair of hooks 10c shown in FIG. 4 of the top end of tubular bodies 10 manufactured of aluminum alloy castings.

Of these, the smoothing reactor 8A on the left side is the smoothing reactor that generates a large quantity of heat, as discussed in connection with the conventional technology, and the smoothing reactor 8B on the right-hand side is the smoothing reactor that generates a small quantity of heat.

In order to prevent generation of heat due to eddy currents, each tubular body 10 is C-shaped, being formed with a groove, not shown, in its axial direction, hard rubber being inserted into this groove, not shown, and fixed.

Of these, an outer frame 9a (approximately cylindrical) of electrically driven fan (or blower) 9A is fixed at the rear end of left tubular body 10 and an outer frame 9b of electrically driven fan (or blower) 9B is fixed at the rear end of right tubular body 10.

When seen from the front view side of FIG. 1, a rubber packing plate 11 of practically the same external shape as release cover 3 and formed with a circular exhaust (evacuation) port 11a on the left and a similar exhaust port 11b on the right is inserted in exhaust port 2c formed at the front face of box 2, this being in contact at top and bottom with the ceiling plate and bottom plate of box 2, its left side being in contact with the inside face on the left of partition plate 2d while its right side is in contact with the left side face of partition 2f.

The front end faces of the left and right tubular bodies 10 are in contact with the under-surface of packing plate 11.

In the rear part of partition plate 2d, a high-speed circuit breaker (air circuit breaker) 13A discussed in connection with the conventional technology is accommodated at the left end, and on the right side a relay unit 13B that accommodates a control relay and the like is accommodated.

Further to the right of this relay unit 13B, an interface unit 13C to which the signal line that is input is connected is accommodated in the interior of this rail way vehicle power conversion device; further to the right of this interface unit 13C, a control device 13D is accommodated that controls the main circuit of the forward conversion section (that is to say, converter) and reverse conversion section (that is to say, inverter).

In an elongate space formed further to the left of the left-hand side partition of electrically driven fan 9A and smoothing reactor 8A in FIG. 3, there are accommodated a current transformer, not shown, that detects the main circuit current (CT) and/or a potential transformer (PT) that measures the main circuit voltage and the like.

Below the ceiling plate of box 2, there is arranged a duct, not shown, that accommodates a cable that connects these to a position behind the smoothing reactors 8A and 8B and above semiconductor cooling unit 7.

Next, the operation of the rail way vehicle power conversion device constructed in this way will be described.

During vehicle running, by rotation of the pair of electrically driven fans 9A and 9B, cooling air is sucked into air dust 6a of the heat-radiating part of semiconductor unit 7 through air filter 5 from inlet port 2b formed on one side in the rail direction of box 2, as shown by the arrow D in FIG. 3.

The cooling air that has flowed into this air dust 6a cools heat-radiating part 7a of semiconductor unit 7 by absorbing its heat, and its flow speed is lowered as it flows into the airflow passage 6b on the downstream side as shown by arrow E in FIG. 3; coils 8a and 8b of smoothing reactors 8A and 8B are cooled by means of the pair of electrically driven fans 9A and 9B, after which the air flows out to the side of the vehicle body (direction of the ties or cross ties) as shown by arrows F1 and F2, from air exhaust port 2c.

Regarding the amounts of cooling air flowing into the airflow passage 6b that are sucked in by the electrically driven fans 9A and 9B, the amount of air that is sucked in by the upstream electrically driven fan 9A is less than the amount of cooling air that is sucked in by the electrically driven fan 9B, due to the effect of the suction provided by electrically driven fan 9B which is positioned on the upstream side of the flow path.

However, by the suction of this downstream side electrically driven fan 9A, low-temperature cooling air flows into the interior of airflow passage 6b through release plate 14 from ventilating port 2e formed in the bottom face to the rear of this electrically driven fan 9A, with the result that the coil 8a of smoothing reactor 8A on the downstream side is cooled by this cooling air.

Consequently, since smoothing reactor 8A, which generates a large quantity of heat, is cooled by cooling air of lower temperature than the cooling air that cools the upstream smoothing reactor 8B, the rise in temperature of the coil in its interior can be cooled to a temperature about the same as that of the coil of smoothing reactor 8B.

It should be noted that, since the back face of the rubber packing plate 11 is in contact with the front end face of tubular body 10 at the periphery of smoothing reactors 8A and 8B, there is no risk of cooling air leaking from the periphery of the tubular bodies to exhaust port 2c or to outside the box.

Also, although exhaust port 2c is formed at the side of the vehicle, no current is passed to the semiconductor unit 7 and smoothing reactors 8A and 8B whilst the train is stationary in the station, so the temperature of the cooling air that is discharged in the direction of the platform from exhaust port 2c is low, so that it causes no problems.

Also, since the cooling air that is discharged from exhaust port 2c is at the side of the vehicle, any risk of cooling of the drive electric motor and/or auxiliary power source that are adjacent in the rail direction of this rail way vehicle control device being obstructed is prevented.

Furthermore, although the mesh of the open plate 14 that is mounted at ventilation port 2e is coarser than the mesh of air filter 5 that is mounted at inlet port 1b, since the smoothing reactors 8A and 8B are of cylindrical shape with no surface irregularities of their cooling faces, there is no risk of accumulation of dust lowering the cooling effect.

Also, since the high-speed circuit breaker 13A that is accommodated between partition plate 2d and the inspection cover 4B behind this partition plate 2d, relay unit 13B and interface unit 13 and control device 13D are provided between inspection cover 4B, which is in contact on one side thereof with the atmosphere, and the side plate around this, together with partition plate 2d where cooling air flows in, rise in temperature of these items of electrical equipment can be suppressed.

Also, since, by opening inspection cover 4B, these can be inspected from the side of the vehicle, or taken out to the outside, maintenance and inspection can easily be performed.

Likewise, when inspection/maintenance of electrically driven fans 9A and 9B is performed, this can be effected by removal of the inspection cover that is formed on the bottom plate below these electrically driven fans 9A and 9B and mounted on the rectangular aperture, described above.

Furthermore, since the total of the thickness of the pair of smoothing reactors 8A and 8B in FIG. 3 and the electrically driven fans 9A and 9B that are superimposed behind these is practically the same as the thickness of the elements of semiconductor unit 7 and heat-absorbing block, not shown, they can be arranged without forming a useless space in the space formed between L-shaped partition plate 2d and release cover 3 and inspection cover 4A, making it possible to reduce the size of box 2.

Although, in the above embodiment, the case was described where the amount of heat generated and the rise in temperature of smoothing reactors 8A and 8B were different, if they are the same or close to being the same, adjustment can be effected by decreasing the size of inlet port 2e formed in the bottom plate, thereby averaging out the cooling conditions of the two smoothing reactors.

For the same reason, if the difference in the amounts of heat generated by smoothing reactors 8A and 8B is larger than the previously mentioned difference of about 100°, averaging out can likewise be effected by increasing the size of inlet port 2e.

Figure 6:
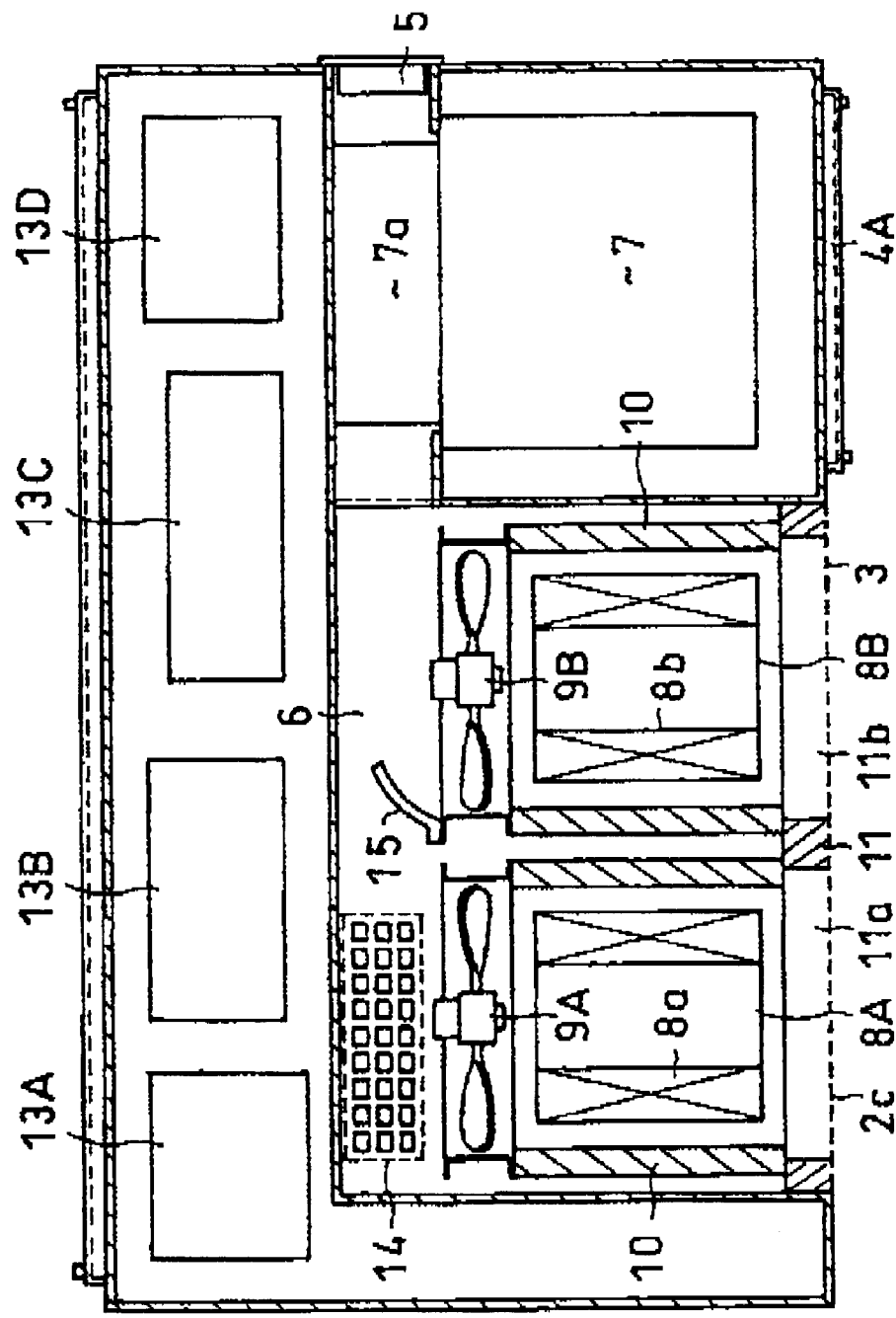
FIG. 6 is a transverse cross-sectional view illustrating a second embodiment of a rail way vehicle power conversion device according to the present invention.

FIG. 6 is a transverse cross-sectional view illustrating a second embodiment of a rail way vehicle power conversion device according to the present invention, corresponding to FIG. 3 illustrating the first embodiment described above.

The particular difference of FIG. 6 with respect to FIG. 3 illustrating the first embodiment described above is that the amount of suction of electrically operated fan 9B is increased by mounting a baffle plate 15 at the back face on the downstream side of outer frame 9b of electrically driven fan 9B.

This can be applied in cases where the difference of the amounts of heat generated by the pair of smoothing reactors 9A and 9B is small; it is possible to cope with variations of the magnitude of the difference of the amounts of heat generated by changing the mounting angle and/or external shape of baffle plate 15.

Figure 7:
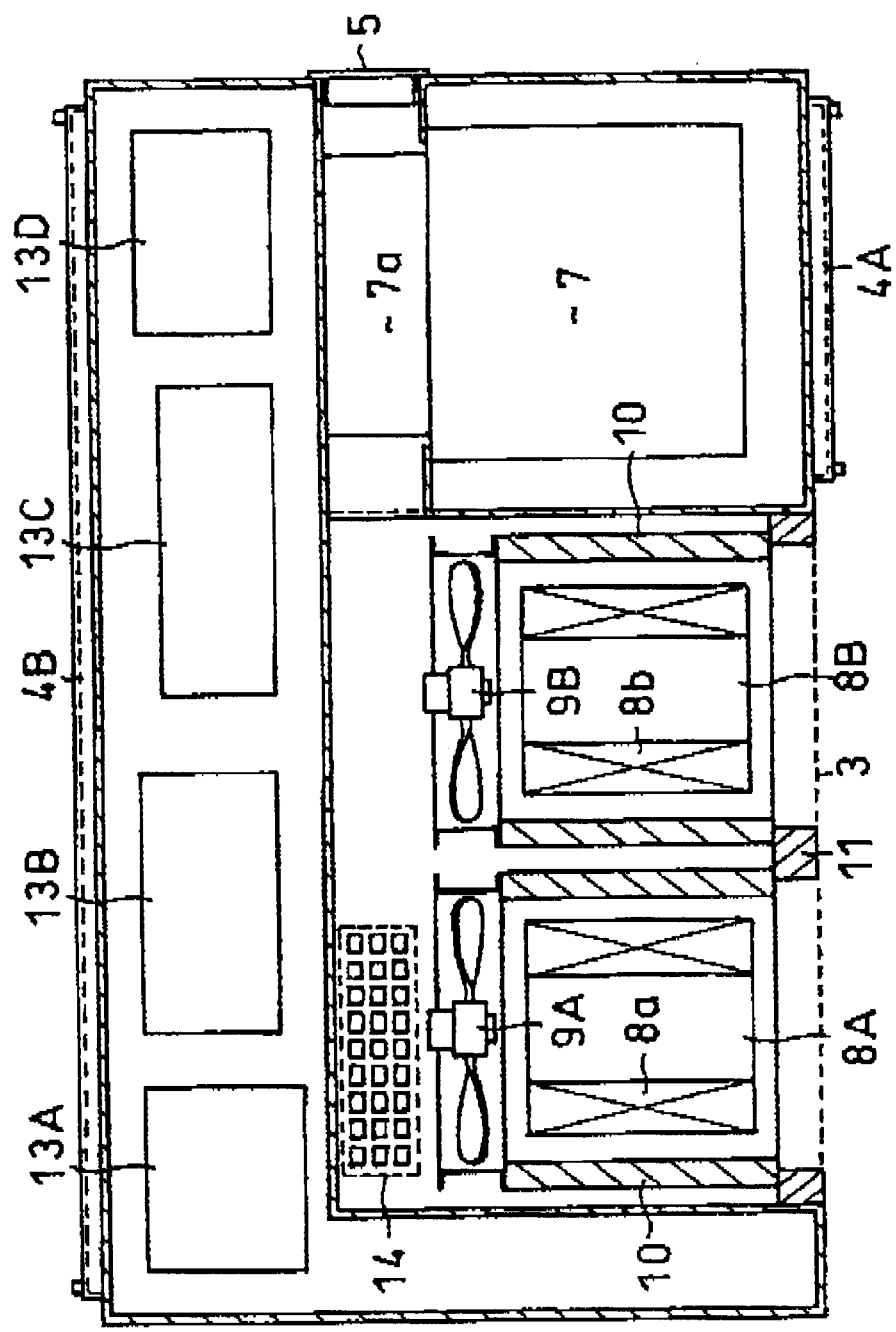
FIG. 7 is a transverse cross-sectional view illustrating a third embodiment of a rail way vehicle power conversion device according to the present invention.

FIG. 7 is a transverse cross-sectional view illustrating a third embodiment of a rail way vehicle power conversion device according to the present invention, corresponding to FIG. 3 and FIG. 6 illustrating the first and second embodiments described above.

The difference in FIG. 7 from FIG. 3 and FIG. 6 illustrating the first and second embodiments described above lies in that the direction of twist of the vanes of electrically driven fan 9B is changed, and the direction of rotation is also consequently changed.

In a rail way vehicle power conversion device constructed in this way, due to the electrically driven fans 9A and 9B being rotated in mutually opposite directions, the vibrations produced by these electrically driven fans 9A and 9B can be canceled, making it possible to prevent vibration of the vehicle body due to transmission of these vibrations and unpleasant sensations to passengers caused by these vibrations.

Figure 8:
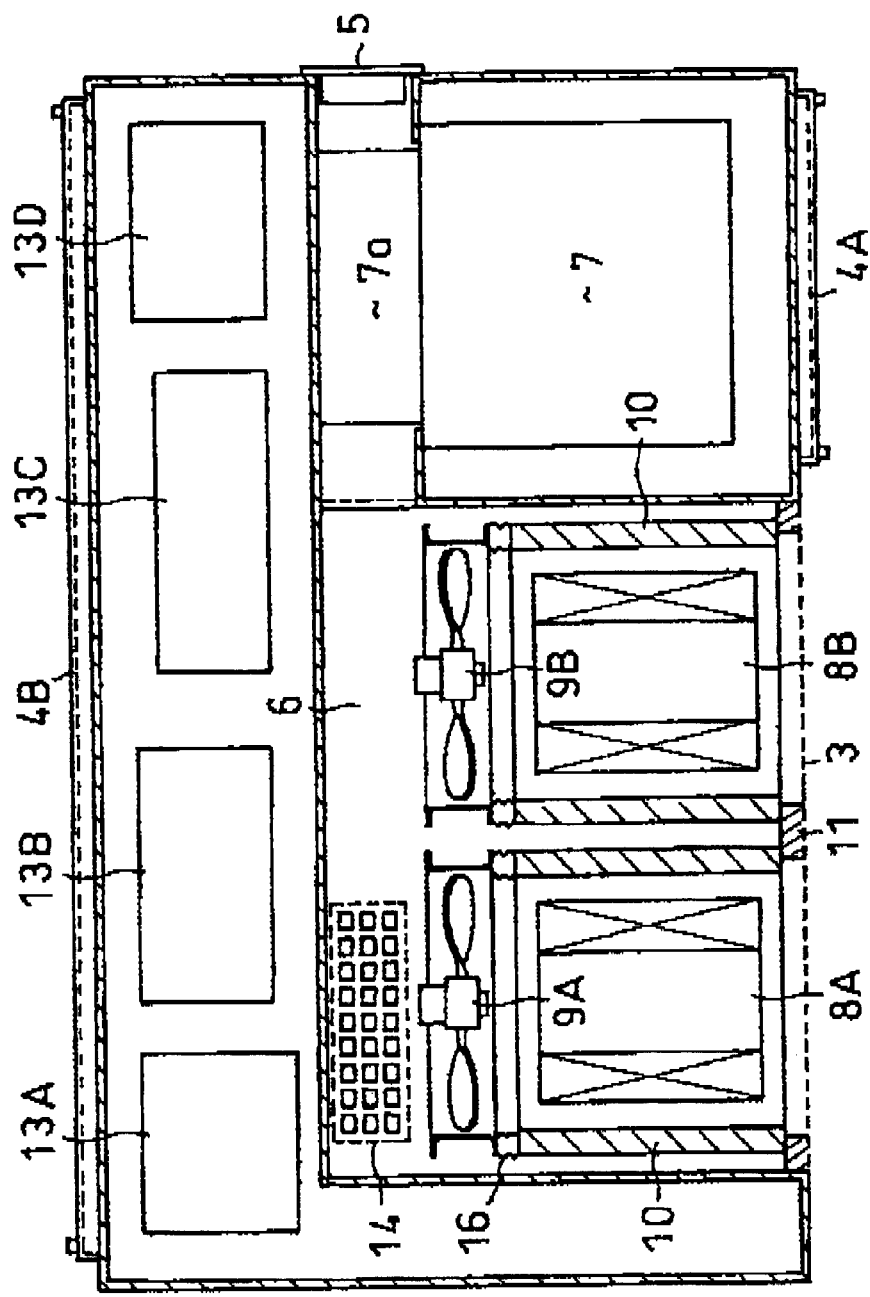
FIG. 8 is a transverse cross-sectional view illustrating a fourth embodiment of a rail way vehicle power conversion device according to the present invention.

FIG. 8 is a transverse cross-sectional view showing a fourth embodiment of a rail way vehicle power conversion device according to the present invention, corresponding to FIG. 3, FIG. 6 and FIG. 7 illustrating the first, second and third embodiments described above.

The particular difference of FIG. 8 from FIG. 3, FIG. 6 and FIG. 7 illustrating the embodiments described above lies in that the outer frames 9a and 9b of electrically driven fans 9A and 9B are fixed to the back face of tubular body 10 at the periphery of smoothing reactors 8A and 8B by means of anti-vibration rubber elements 16; otherwise, this embodiment is the same as the embodiment illustrated in FIG. 3, described above.

That is, anti-vibration rubber elements 16 are mounted at intervals of 90°, at the back face of the tubular body 10 at the periphery of smoothing reactors 8A and 8B, and electrically driven fans 9A and 9B are fixed at the rear faces of these anti-vibration rubber elements 16.

In a rail way vehicle power conversion device constructed in this way, propagation of vibration generated by electrically driven fans 9A and 9B to tubular body 10 can be prevented, and propagation through the box to the interior of the vehicle from this tubular body 10 can be prevented.

Figure 9:
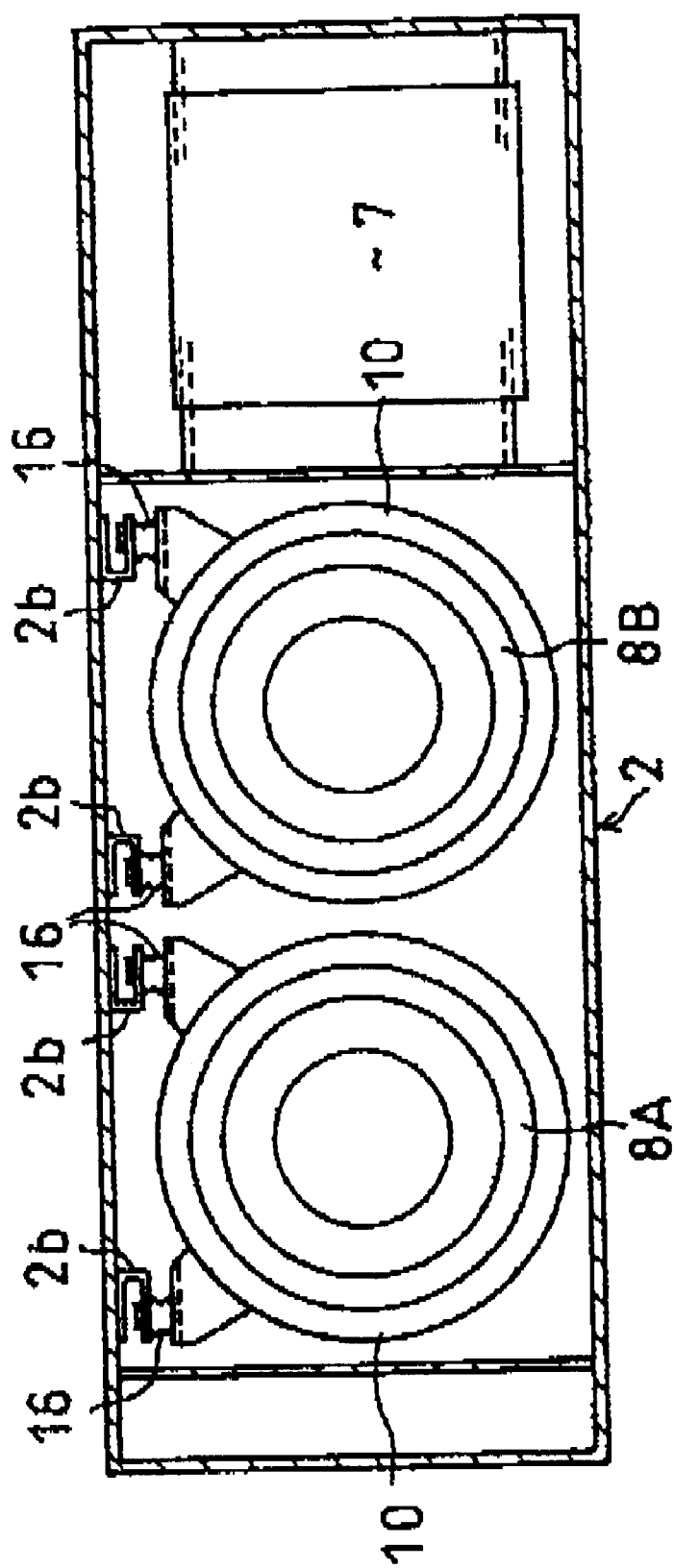
FIG. 9 is a transverse cross-sectional view illustrating a fifth embodiment of a rail way vehicle power conversion device according to the present invention.

FIG. 9 is a transverse cross-sectional view illustrating a fifth embodiment of a rail way vehicle power conversion device according to the present invention, corresponding to FIG. 3, FIG. 6, FIG. 7 and FIG. 8 illustrating the embodiments described above.

The particular difference of FIG. 9 and FIG. 3, FIG. 6, FIG. 7 and FIG. 8 illustrating the embodiments previously described lies in that anti-vibration rubber elements are provided between mounting feet 10c of tubular body 10 and the ceiling plate of the box; otherwise this is the same as FIG. 3, FIG. 6, FIG. 7 and FIG. 8.

Specifically, four channel-section reinforcing plates 2b are welded on the inside face of the ceiling plate of the box, two sets of anti-vibration rubber elements 15 being mounted on the under-surface of these reinforcing plates 2b, and tubular body 10 being suspended on the ceiling plate of the box through these two sets of anti-vibration rubber elements 15.

Propagation of the vibration of these electrically driven fans fixed at the rear side of tubular body 10 through tubular body 10 can also be prevented in such a rail way vehicle power conversion device in which anti-vibration rubber elements 16 are mounted on the under-surface side of reinforcing plates 2b of the ceiling plate of the box and the tubular body 10 of the smoothing reactors is suspended by means of these anti-vibration rubber elements 16.

As described above, according to the present invention, in a rail way vehicle power conversion device wherein a semiconductor power conversion cooling unit, a pair of smoothing reactors and a pair of electrically driven fans which cool these are accommodated in the interior of a box suspended under the floor of the vehicle, an airflow passage of L-shaped transverse cross section is provided, formed with an inlet port on one side in the rail direction of the box and formed with an exhaust port on one side in the tie direction of the box; the semiconductor power conversion cooling unit is accommodated in a region adjacent the airflow passage on one side in the tie direction of the box, with a heat-radiating part thereof projecting on the air inlet side of the airflow passage; the pair of smoothing reactors being accommodated in the rail direction on the exhaust side of the airflow passage; and the electrically driven fans being arranged adjacent the air inlet side of these smoothing reactors; thus the flow speed of the cooling air passing through this exhaust path can be lowered and the difference in cooling conditions of the reactors can be decreased, by accommodating the pair of reactors in an exhaust path formed by bending in a direction orthogonal to the air inlet path of the airflow passage; consequently demands for increased capacity, reduced size and reduced weight and laborsaving in regard to maintenance and inspection can be met, making it possible to obtain a rail way vehicle power conversion device that can cope with increased train speeds.

Also, according to the present invention, the smoothing reactor on the downstream side, whose cooling conditions are impaired compared with the smoothing reactor on the upstream side, is cooled by cooling air flowing in from an auxiliary aperture, by forming an auxiliary inlet port in the bottom plate of the box on the air inlet side of the electrically driven fan on the air inlet side of the reactor on the downstream side of the pair of smoothing reactors, so the smoothing reactor on the downstream side, whose cooling conditions are impaired compared with the smoothing reactor on the upstream side of the airflow passage, is cooled by cooling air flowing in from the auxiliary aperture.

Furthermore, according to the present invention, the pair of smoothing reactors may be of cylindrical shape, these smoothing reactors being accommodated in the tubular body, this tubular body being suspended in the box; whereby, mutually by means of the tubular smoothing reactors and the tubular body, pressure lose of the cooling air passing between these is decreased, making it possible for the cooling of the coils to be made uniform over their entire peripheries; consequently, mutually by means of the tubular smoothing reactors and the tubular body, pressure loss of the cooling air passing between these is decreased, making it possible for the cooling of the coils to be made uniform over their entire peripheries.

Furthermore, according to the present invention, the outer frame of the electrically driven fans may be cylindrical, the electrically driven fans being fixed on the air inlet side of the tubular body by means of this outer frame; outflow of cooling air into the exhaust port of the airflow passage from outside this outer frame is thereby prevented by the outer frame of the electrically driven fans being made cylindrical; consequently, outflow of cooling air into the exhaust port of the airflow passage from outside this outer frame can be prevented by the outer frame of the electrically driven fans being made cylindrical.

Furthermore, according to the present invention, of the pair of smoothing reactors, the smoothing reactor of largest amount of heat generation is arranged on the downstream side of the exhaust side of the airflow passage, so that the smoothing reactor that generates the largest amount of heat is cooled by the cooling air that is sucked in by the electrically driven fan on the downstream side of the inflow from the auxiliary inlet port; consequently, the smoothing reactor that generates the largest amount of heat can be cooled by the cooling air that is sucked in by the electrically driven fan on the downstream side of the inflow from the auxiliary inlet port.

Furthermore, according to the present invention, an air filter may be arranged at an air inlet port of the airflow passage; a mesh plate may be arranged at the auxiliary air inlet port, being of coarser mesh than the mesh of this air filter; and an exhaust mesh plate may be arranged at the exhaust port of the airflow passage, being of even coarser mesh than the mesh of the mesh plate, so that adhesion of dust to the heat-radiating part of the semiconductor conversion unit is prevented by the air filter and inflow of coarse dust from the auxiliary inlet port is prevented by the mesh plate at the auxiliary air inlet port; consequently, adhesion of dust to the heat-radiating part of the semiconductor conversion unit can be prevented by the air filter and inflow of coarse dust from the auxiliary inlet port can be prevented by the mesh plate at the auxiliary air inlet port.

Furthermore, according to the present invention, an electrical components chamber in which electrical components for control purposes are accommodated may be formed on the other side of the airflow passage in the direction of the ties, so that the rise in temperature of the electrical components for control purposes is suppressed by the side plate of the electrical components chamber, which has a large area of contact with the external atmosphere; consequently, the rise in temperature of the electrical components for control purposes can be suppressed by the side plate of the electrical components chamber, which has a large area of contact with the external atmosphere.

Furthermore, according to the present invention, a baffle plate is provided on the downstream side of the frame of the electrically driven fan on the air inlet side of the reactor on the upstream side, of the pair of smoothing reactors, so that the difference in cooling conditions on the upstream side and downstream side is averaged out by the baffle plate; consequently, the difference in cooling conditions on the upstream side and downstream side can be averaged out by the baffle plate.

Furthermore, according to the present invention, a release cover may be provided at the exhaust port of the box; and an inspection cover provided on the side of the semiconductor power conversion unit of this release cover and on the other side of the box in the direction of the ties and below the electrically driven fan in the bottom plate, so that cooling air discharged to the outside from the exhaust port is discharged from the release cover and inspection of the semiconductor power conversion unit can be performed by opening the inspection cover; consequently, cooling air discharged to the outside from the exhaust port can be discharged through the release cover and inspection of the semiconductor power conversion unit can be performed by opening the inspection cover.

Furthermore, according to the present invention, rectangular packing may be arranged on the exhaust side of the pair of smoothing reactors, which are formed with a pair of exhaust ports, so that outflow of cooling air from the periphery of the tubular body to the exhaust ports is prevented by the packing; consequently, outflow of cooling air from the periphery of the tubular body to the exhaust ports can be prevented by the packing.

Furthermore, according to the present invention, anti-vibration rubber elements may be arranged between the smoothing reactors and the frames of the electrically driven fans, so that propagation of vibration generated by rotation of the electrically driven fans is prevented by the anti-vibration rubber elements; consequently, propagation of vibration generated by the rotation of the electric driven fans can be prevented by the anti-vibration rubber elements.

Furthermore, according to the present invention, the vanes of the pair of electrically driven fans may be in mutually opposite directions and their directions of rotation may be opposite, so that the vibrations generated by rotation of the electrically driven fans are cancelled; consequently, by making the directions of rotation of the electrically driven fans mutually opposite, the vibration generated by rotation of the electrically driven fans can be cancelled.

Obviously, numerous additional modifications and variations of the present invention are possible in light of the above teachings. It is therefore to be understood that within the scope of the appended claims, the present invention may be practiced otherwise than as specifically described herein.

What is claimed is:

1. A railway vehicle power conversion device comprising:
   a box suspended under a floor of a vehicle;
   an airflow passage having an L-shaped transverse cross section formed in said box, said air flow passage including an air inlet side having an inlet port formed on one side of said box and an exhaust side having an exhaust port formed on another side of said box; and
   a power conversion device included in said box, said power conversion device comprising:
      a semiconductor power conversion cooling unit having a heat-radiating part projecting into said air inlet side of said air flow passage;
      a pair of smoothing reactors included in said exhaust side of said air flow passage; and
      a pair of electrically driven fans for cooling said smoothing reactors, said electrically driven fans being arranged adjacent to an air inlet side of said smoothing reactors.

2. The railway vehicle power conversion device according to claim 1, further comprising:

an auxiliary inlet port formed in a bottom plate of said box, said auxiliary inlet port being formed on an air inlet side of one of said electrically driven fans corresponding to one of said smoothing reactors arranged on a downstream side of said exhaust side of said airflow passage.

3. The railway vehicle power conversion device according to claim 1 or claim 2, further comprising:

a pair of tubular bodies of cylindrical shape accommodating said smoothing reactors, each of said tubular bodies being suspended in said box.

4. The railway vehicle power conversion device according to claim 3, wherein an outer frame of each of said electrically driven fans is cylindrical and is fixed to an inlet side of said tubular body.

5. The railway vehicle power conversion device according to claim 1, wherein, of said smoothing reactors, a smoothing reactor having greater heat generation is arranged on a downstream side of said exhaust side of said airflow passage.

6. The railway vehicle power conversion device according to claim 2, further comprising:

an air filter secured to said inlet port of said airflow passage;

a mesh plate secured to said auxiliary inlet port, said mesh plate having a coarser mesh than a mesh of said air filter; and an exhaust mesh plate secured to said exhaust port of said airflow passage, said exhaust mesh plate having a coarser mesh than said mesh of said mesh plate.

7. The railway vehicle power conversion device according to claim 1, further comprising:

an electrical component chamber accommodating electrical components, the electrical component chamber being formed in said box and outside said air flow passage.

8. The railway vehicle power conversion device according to claim 1, further comprising:

a baffle plate secured to a frame of one of said electrically driven fans arranged on an upstream side of said exhaust side of said airflow passage.

9. The railway vehicle power conversion device according to claim 2, further comprising:

a release cover provided at said exhaust port of said box;

an inspection cover covering said semiconductor power conversion cooling unit;

a second inspection cover provided on an opposite side of said release cover; and a third inspection cover provided in said bottom plate.

10. The railway vehicle power conversion device according to claim 1, further comprising:

a rectangular packing arranged on an exhaust side of said smoothing reactors, said rectangular packing having a pair of exhaust ports.

11. The railway vehicle power conversion device according to claim 1, further comprising:

a plurality of anti-vibration rubber elements arranged between said smoothing reactors and frames of said electrically driven fans.

12. The railway vehicle power conversion device according to claim 1, wherein vanes of said pair of electrically driven fans are configured to rotate in mutually opposite directions.

* * * * *